United States Patent [19]

Druminski et al.

[11] 4,141,765
[45] Feb. 27, 1979

[54] PROCESS FOR THE PRODUCTION OF EXTREMELY FLAT SILICON TROUGHS BY SELECTIVE ETCHING WITH SUBSEQUENT RATE CONTROLLED EPITAXIAL REFILL

[75] Inventors: Manfred Druminski, Vaterstetten; Roland Gessner, Geretsried, both of Fed. Rep. of Germany

[73] Assignee: Siemens Aktiengesellschaft, Berlin, Munich, Fed. Rep. of Germany

[21] Appl. No.: 897,507

[22] Filed: Apr. 18, 1978

Related U.S. Application Data

[63] Continuation of Ser. No. 658,277, Feb. 17, 1976, abandoned.

[30] Foreign Application Priority Data

Feb. 17, 1975 [DE] Fed. Rep. of Germany ....... 2506624

[51] Int. Cl.² .................. H01L 21/205; H01L 21/306
[52] U.S. Cl. ....................................... 148/175; 29/580; 156/612; 156/647; 156/653; 156/657; 156/662; 357/55; 357/60
[58] Field of Search ................ 148/175; 156/612, 647, 156/653, 657, 662; 29/580; 357/55, 60

[56] References Cited

U.S. PATENT DOCUMENTS

| | | | |
|---|---|---|---|
| 3,370,995 | 2/1968 | Lowery et al. | 148/175 |
| 3,403,439 | 10/1968 | Bailey | 148/175 X |
| 3,421,055 | 1/1969 | Bean et al. | 148/175 X |
| 3,425,879 | 2/1969 | Shaw et al. | 148/175 |
| 3,566,220 | 2/1971 | Post | 148/175 X |
| 3,629,016 | 12/1971 | Glendinning | 148/175 |
| 3,745,043 | 7/1973 | Bradley | 427/86 |
| 3,764,409 | 10/1973 | Nomura et al. | 148/175 |
| 3,793,712 | 2/1974 | Bean et al. | 29/580 X |
| 3,853,974 | 12/1974 | Reuschel et al. | 148/174 X |

OTHER PUBLICATIONS

Gupta, D. C., "Improved Methods of Depositing . . . Silicon," Solid State Tech., Oct. 1971, pp. 33–40.
Sugawara, K., "Facets Formed by Hydrogen Chloride . . ." J. Electrochem. Soc., vol. 118, No. 1, Jan. 1971, pp. 110–114.
Jackson, D.M., "Advanced Epitaxial Process . . . Applications," Trans. Metallurgical Soc. of AIME, vol. 233, Mar. 1965, pp. 596–602.
Sirtl et al., "Selective Epitaxy . . . Conditions," Semiconductor Silicon, 1969, pp. 189–199.

Primary Examiner—L. Dewayne Rutledge
Assistant Examiner—W. G. Saba
Attorney, Agent, or Firm—Hill, Gross, Simpson, Van Santen, Steadman, Chiara & Simpson

[57] ABSTRACT

The invention relates to a method for the production of extremely flat silicon troughs in a silicon substrate for MOS-transistors. The object is generally achieved by a localized etching process resulting in a slightly anisotropic trough characteristic and a subsequent rate controlled filling by a selection epitaxy process of said trough with a silicon material. The process is found to minimize the deleterious non-uniformities inherent in the prior art.

2 Claims, 6 Drawing Figures

PROCESS FOR THE PRODUCTION OF EXTREMELY FLAT SILICON TROUGHS BY SELECTIVE ETCHING WITH SUBSEQUENT RATE CONTROLLED EPITAXIAL REFILL

This is a continuation of application Ser. No. 658,277, filed Feb. 17, 1976, now abandoned.

BACKGROUND OF THE INVENTION

1. Field of the Invention

The present invention provides a method for the production of extremely flat silicon troughs in a silicon substrate for MOS-transistors. The object of the invention is achieved by firstly employing a mask over the silicon substrate, forming the trough by a localized etching process such that each trough is made slightly anisotropic and has a degree of lateral underetching of said mask and then filling rate-controllably each of said troughs with silicon material by a selective epitaxy process.

2. Prior Art

The production of doped silicon troughs in a silicon substrate of the opposite conductivity type and orientation (100) for MOS-transistors is well known in the Art. This production, can, as described in the publication E. Sirtl and H. Seiter "Selective Epitaxy Under Quasi-Equilibrium Conditions," Semiconductor Silicon 1969, pages 189 to 199, in particular for (111)-substrates, be effected by means of selective epitaxy. The epitaxial process has the advantage that a standard doping or doping profile can be produced, which can be achieved only with great difficulty with pure diffusion. In the epitaxial process firstly a masking technique is used to etch troughs into the semiconductor material of the one conductivity type, which are subsequently filled with silicon material of the opposite conductivity type. Following the removal of the masking layers the filled troughs should be as flat as possible, that is, where as possible there should be no graduations at the surface between the material of the substrate and the material of the troughs. The requirement of as ideal a flatness as possible is based on the further process steps. For example during these subsequent process steps, mounds formed at the junction between the substrate material and the material of the full trough could scratch and damage the masks required for the masking technique.

The silicon mounds which were formed at the mask edges during the production of silicon troughs by selective epitaxy in accordance with the previously known processes must be eliminated for the reasons given above, which, in the methods of the prior art, has been effected by grinding or polishing.

A particular disadvantage of the mechanical removal of these mounds consists in the fact that fresh disturbances are caused by polishing damage. For example the materials of the troughs and the substrate are removed at different rates as they exhibit differing hardnesses.

SUMMARY OF THE INVENTION

The object of the invention is to provide a process for the production of extremely flat silicon filled troughs by means of localized etching and selective epitaxy, as a result of which the formation of mounds at the mask edges is avoided as far as possible. The object of the invention is achieved by firstly employing a mask over the silicon substrate, forming the troughs by a localized etching process such that each trough is made slightly anisotropic and has therefore a degree of lateral underetching of said mask and then filling rate-controllably each of said troughs with silicon material by a selective epitaxy process.

The lateral underetching of said mask and the depth of each of said troughs are designed such that their ratio correspond to a predetermined subsequent epitaxy growth rate ratio between the epitaxial growth rate of epitaxially grown silicon in a direction parallel to the sloped side walls of each trough and the epitaxial growth rate of epitaxially grown silicon in a direction parallel to the base of each of said troughs. In view of the predetermined growth rate ratios, the silicon material growing laterally parallel to the side walls of said trough and the silicon material growing parallel to the base of said trough reach the underetched mask simultaneously making for a uniform unmodulated profile.

The following considerations led to the invention. In the process employed in the publication quoted in the Background of the Invention, during the filling of the etched troughs by the decomposition of $SiCl_4$ and $H_2$, in accordance with the deposition conditions employed, in addition to other disturbances, silicon was deposited upon the mask 2 in the vicinity of the trough. By operating under quasi-equilibrium conditions, the reaction which takes place in accordance with the formula $SiCl_4 + 2H_2 \rightleftarrows Si + 4HCl$ can be controlled by the addition of HCl in such manner that silicon deposition on the mask is substantially minimized if not completely prevented. This process is described by E. Sirtl and H. Seiter. However, this method of filling results in a mound formation at the edges of the mask. These mounds 8, which occur at the mask edges and extend to greater or lesser levels and which are shown in FIG. 6 of the quoted publication prove extremely disturbing for the subsequent processing. This mound formation is stated by the authors as being due in particular to the reaction between $SiO_2$- mask and the silicon. This reaction which takes place in accordance with the formula $Si + SiO_2 \rightleftarrows 2\, SiO$, leads to etching and during the filling of the troughs gives rise to disturbances during growth.

It has been observed that average-height mounds, having a height of approx. 2 to 3 $\mu m$ occur following corresponding pretreatment (trough etching) even when a substitute $Si_3N_4$ mask is used. Conversely, it has been observed that when an oxide mask is employed the mound height can in fact be reduced by a corresponding pre-treatment (trough etching). Accordingly the manner in which the trough etching and the later filling is carried out are of decisive importance.

Advantageously the process in accordance with the invention can be used for the production of complementary-MOS-transistors.

In the following the invention will be explained in detail making reference to the Figures and the description.

DESCRIPTION OF THE PREFERRED EMBODIMENTS

Figure 1:
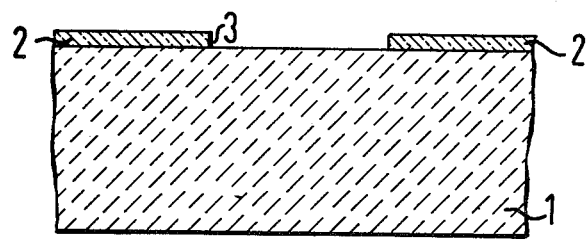
FIG. 1 schematically illustrates a semiconductor substrate having a masking layer applied thereto in accordance with the principles of the invention.
Figure 2:
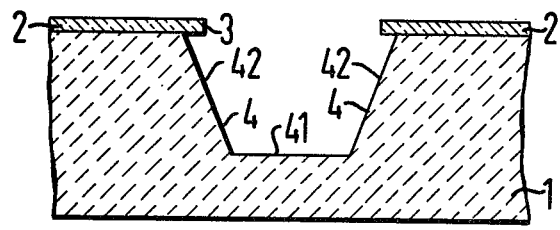
FIG. 2 schematically illustrates a semiconductor substrate having a trough therein in accordance with the principle of the invention.
Figure 3:
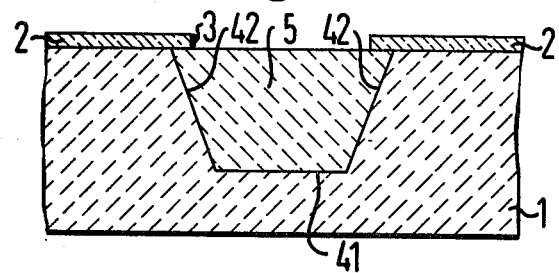
FIG. 3 schematically illustrates a semiconductor substrate having a silicon material deposited within said trough in accordance with the principle of the invention.
Figure 4:
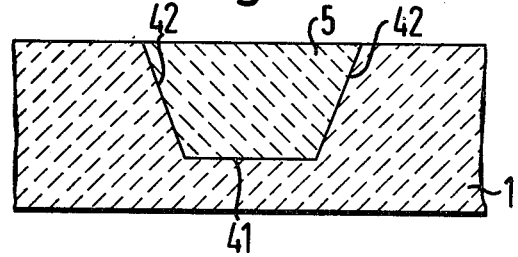
FIG. 4 schematically illustrates a semiconductor substrate comprising a trough having a doped silicon material deposited therein and having a masking layer removed in accordance with the principles of the invention.

In FIG. 1, the semiconductor substrate, which, for example, is a n-silicon substrate, is generally referenced by reference numeral 1. To this substrate is firstly applied a masking layer 2, which for example consists of silicon dioxide or silicon nitride. Openings 3, for the production of the troughs are etched into this masking layer. A trough is generally denoted by reference numeral 4 in FIG. 2. It consists of a base surface 41 exhibiting an [100]-orientation and side walls 42 exhibiting an [111]-orientation. The troughs extend to a depth of approx. 8 to 10 μm into the silicon substrate 1. The filling of the troughs with, for example, p-doped silicon may be localized selectively in said troughs and not upon the mask. This is effected, for example by the CVD (chemical vapor deposition) process, known per se which, in the prior art, is carried out by the decomposition of $SiCl_4$ and $H_2$, or of $SiCl_4$, HCl and $H_2$. FIG. 3 depicts a doped silicon material 5 having been deposited in said trough 4. In a final process step the masking layer 2 is removed so that the arrangement illustrated in FIG. 4 is obtained.

Figure 5:
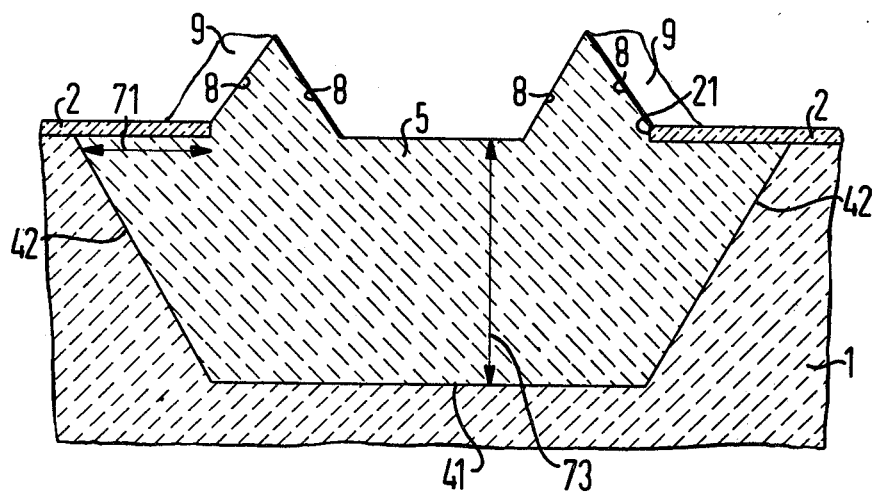
FIG. 5 schematically illustrates the mound formation at the mask edges in the process of the prior art.
Figure 6:
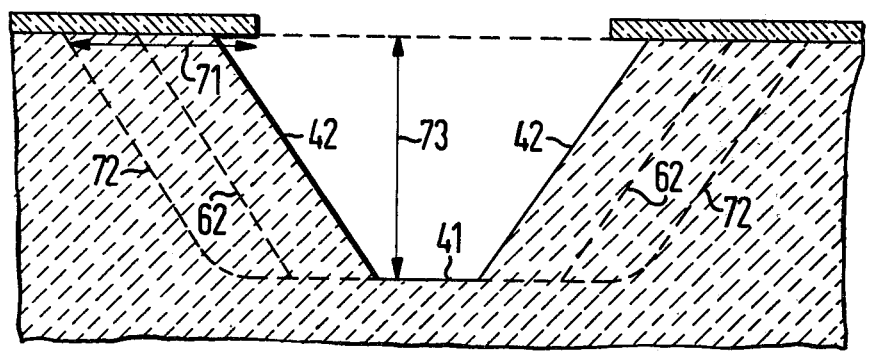
FIG. 6 schematically illustrates various sub-etching profiles which occur during the trough etching.

In the following the invention is to be explained in detail in association with FIGS. 5 and 6.

In accordance with the invention, the selective trough etching is carried out directly prior to the filling of the troughs in the epitaxy reactor. Hydrogen halides, for example HCl or HBr, or halogen and hydrogen, for example $Br_2$ + $H_2$ are employed as etching agents for the chemical etching. With the aid of gas etching, in accordance with the invention, anisotropic etchings are produced which, in dependence upon the etching temperatures, exhibits greater or lesser underetchings. For example, gas etching with HCl (2 to 20 mol% and, etching rates of up to approx. 20 μm per minute) at etching temperatures of approx. 1150° C produces an anisotropic etching with slight underetching. FIG. 6 illustrates a trough produced in this via lines 42 and 41. If the etching temperature is increased to above 1200° C, the anisotropic etching with slight underetching is transformed into a slightly anisotropic etching with a greater degree of underetching. In FIG. 6 the slopes produced in this way correspond to the broken lines marked with reference numeral 62. This indicates that the etching rate in the [100] direction is only slightly dependent upon the temperature, whereas the etching rate in the [111] direction considerably increases with increasing temperature.

When the trough is refilled, the underetched masking layer 2 prevents growth on the [111]-oriented slopes in the [100] direction, so that the silicon only grows in the [111] direction. The mounds 8 represented in FIG. 5 are formed when silicon having a [111]-orientation is growing laterally parallel to the slope and reaches an exposed end 21 of the underetched mask 2 earlier than the silicon having a [100]-orientation which is growing in parallel to the base surface 41. From this instant onwards the silicon is able to grow in the [100] direction and can thus form the mounds 8 at the edges of the mask. When SiO-masks are used, the above-mentioned reaction between this mask and the silicon of the mound gives rise to additional growths 9 which consist of heavily twinned or even polycrystalline silicon material.

In the invention a mound formation is prevented in that by virtue of a determined underetching and the selection of a determinate growth ratio between the epitaxial growth rate of epitaxially grown silicon in a direction parallel to the sloped side walls of each trough in the [111]-plane and the epitaxially grown silicon in a direction parallel to the base of a trough in the [100]-plane. This ratio ensured that the silicon material growing parallel to the trough side walls reaches the end 21 of the mask substantially simultaneously with the silicon material growing parallel to the trough base.

The precise adjustment of the mask windows — i.e. the openings in the masking layer 2 as viewed from the top, must be located parallel to the [110]-orientation. Even a slight misorientation between the trough base [100]-plane and the lateral slopes or walls in the [111]-plane produces additional surfaces having a [113]-orientation, which are unfavorable for desired refilling.

An advantage of the high etching rates attained for example with HCl (up to 20 μm/min) at a temperature ranging between about 1150° to 1300° C. and preferably at a temperature of at least 1200° C. consists in that it is possible to achieve virtually flat trough bases 41. Furthermore on account of the short periods of dwell, the above-mentioned etching reactions are only very slight.

In accordance with the invention, following the trough etching which is carried out preferably by gas etching with e.g. HCl, the selective filling is carried out with the aid of the CVD-process by the decomposition of preferably $SiH_4$, HCl and $H_2$. The following table indicates the dependence of the growth profile upon the nature of the etching and the etching temperature. The table applies to filling by the decomposition of $SiH_4$, HCl and $H_2$, or of $SiCl_4$ and $H_2$.

| Etching Temperature | Nature of Etching | Growth Profile |
|---|---|---|
| 1100° C | Anisotropic (FIG. 6, reference 42) | considerable mound formation |
| 1100° ... 1200° C $t_{etch}$ | Increasingly less anisotropic (FIG. 6, Reference 62) | Average mound formation |
| >1200° C | Only slightly anisotropic (FIG. 6, Reference 72) | Slight mound formation |

The height of the mounds formed can be further reduced by the use of $Si_3N_4$ masks.

The above table shows that the difference between a greater and lesser mound formation is dependent on the nature of and the degree of the particular underetching. A heavily underetched mask serves to impede the mound formation during filling, and following anisotropic etching, growth on slopes having a [111]-orientation in the [100] direction is prevented until the growing silicon is not longer protected by a mask covering. In addition, the ratio between the growth rate in the [111]-direction to the growth rate in the [100]-direction plays a role in this effect.

Therefore, in order to produce extremely flat silicon troughs by means of selective etching and selective epitaxy, in accordance with the invention, as described above, slightly anisotropically etched troughs are produced in the silicon substrate by HCl gas etching at an etching temperature of $t_{etch} \geq 1200°$ C. The etching is carried out with preferably 0.1 to 20 mol% HCl at a high etching rate of up to 20 μm/min. The trough bases produced in this way are advantageously practically flat. Utilizing the method for filling the troughs a mixture of SiCl and SiCl$_4$ and HCl and H$_2$, the mound height can be kept low. In particular when a nitride mask is used, the mound height can be kept substantially to a minimum. Filling in the system SiH$_4$/HCl/H$_2$ is the most favorable. In this case, on account of the greater freedom in the mixing of the components, the mounds can be caused to entirely disappear, preferably by using a nitride mask and, a deposition temperature of approx. 1150° C and a growth rate of 2 μm/min.

Under these conditions the growth rate ratio in the troughs is $r$ [111] : $r$ [100] 1 : 1.2, so that the silicon growth on the [111]-orientated trough walls or slopes is slower than on the [100]-orientated trough bases. This growth rate ratio, in combination with the mound-impeding effects of the underetched masking layer, thus virtually suppresses the mound formation, especially, when the growth ratio $r$ [111] : $r$ [100] corresponds to the ratio reached during the previous etching between lateral underetching and depth of the trough. On account of the short periods of dwell during the etching at a high etching rate and a rapid refilling of the trough at a high growth rate, undesired reactions between the silicon and the mask are restricted to a minimum or are virtually eliminated.

We claim as our invention:

1. A method of producing a plurality of flat silicon-filled troughs in a silicon substrate of one conductivity type and having a planar surface with a [100]-orientation, comprising the steps of:

(a) forming a mask consisting of a material selected from the group of Si$_3$N$_4$ and SiO$_2$, with windows having peripheral edges substantially parallel to a [110]-orientation so that select areas of such substrate are exposed through such window edges;

(b) subjecting said select areas of the substrate to controlled anisotropic etching conditions which comprise gas etching with an etchant gas containing hydrogen and a halogen at a temperature in the range of about 1150° C. to 1300° C. so that a trough is formed beneath each window, said trough having a base located at a first distance extending below the planar surface of said select substrate areas and substantially parallel to the [100]-orientation of said planar surface, said trough having a plurality of lateral walls extending at an obtuse angle upwardly from said base into contact with a locus on said mask located at a second distance from the peripheral edges of said windows so that edges of said mask overlie portions of said trough, said lateral trough walls having surfaces substantially parallel to a [111]-orientation;

a predetermined ratio being defined between said first and second distances which substantially corresponds to the ratio between the epitaxial growth rate of epitaxially grown silicon in a direction parallel to said trough base and the epitaxial growth rate of epitaxially grown silicon in a direction parallel to said trough walls so that silicon growing parallel to said trough base reaches the window edges substantially simultaneously with silicon growing parallel to said trough walls; and (c) epitaxially depositing a silicon material of a conductivity type different from that of said substrate within said troughs via a chemical vapor deposition process with a gaseous system selected from the group consisting of SiCl$_4$/H$_2$ and SiH$_4$/HCl/H$_2$ at a temperature of about 1150° C. so as to fill said troughs and define a flat planar surface substantially corresponding to the surface of said select substrate areas.

2. A method as defined in claim 1 wherein subjecting select areas of the substrate to controlled anisotropic etching conditions consists of etching with 0.1 to 20 mol percent of HCl at a temperature of at least 1200° C.

* * * * *